(12) United States Patent
Fest

(10) Patent No.: US 11,990,257 B2
(45) Date of Patent: May 21, 2024

(54) THIN FILM RESISTOR (TFR) FORMED IN AN INTEGRATED CIRCUIT DEVICE USING WET ETCHING OF A DIELECTRIC CAP

(71) Applicant: Microchip Technology Incorporated, Chandler, AZ (US)

(72) Inventor: Paul Fest, Chandler, AZ (US)

(73) Assignee: Microchip Technology Incorporated, Chandler, AZ (US)

(*) Notice: Subject to any disclaimer, the term of this patent is extended or adjusted under 35 U.S.C. 154(b) by 822 days.

(21) Appl. No.: 17/071,356

(22) Filed: Oct. 15, 2020

(65) Prior Publication Data
US 2021/0272726 A1 Sep. 2, 2021

Related U.S. Application Data

(60) Provisional application No. 62/982,107, filed on Feb. 27, 2020.

(51) Int. Cl.
*H01C 17/30* (2006.01)
*H01C 7/00* (2006.01)
*H01C 17/00* (2006.01)
*H01L 27/06* (2006.01)
*H01L 49/02* (2006.01)

(52) U.S. Cl.
CPC ............ *H01C 17/30* (2013.01); *H01C 7/006* (2013.01); *H01C 17/006* (2013.01); *H01L 27/0629* (2013.01); *H01L 28/24* (2013.01); *Y10T 29/49082* (2015.01)

(58) Field of Classification Search
CPC .............. H01L 28/20; H01L 21/31053; H01L 21/32051; H01L 21/76802; H01C 7/006; H01C 17/006; H01C 17/30; Y10T 29/49099; Y10T 29/49082
USPC ............................ 29/610.1, 592.1, 613, 620
See application file for complete search history.

(56) References Cited

U.S. PATENT DOCUMENTS

| 9,455,312 B2* | 9/2016 | Liu .................. H01L 21/76834 |
| 10,276,648 B1 | 4/2019 | Liu et al. |
| 10,784,193 B2* | 9/2020 | Hong ...................... H01L 28/24 |
| 2006/0181388 A1 | 8/2006 | Chinthakindi et al. ....... 338/309 |

(Continued)

OTHER PUBLICATIONS

International Search Report and Written Opinion, Application No. PCT/US2020/061510, 14 pages, dated Feb. 23, 2021.

*Primary Examiner* — Thiem D Phan
(74) *Attorney, Agent, or Firm* — SLAYDEN GRUBERT BEARD PLLC

(57) ABSTRACT

A process is provided for forming an integrated thin film resistor (TFR) in an integrated circuit (IC) device including IC elements and IC element contacts. A TFR film layer and TFR dielectric layer are formed over the IC structure, and a wet etch is performed to define a dielectric cap with sloped lateral edges over the TFR film layer. Exposed portions of the TFR film layer are etched to define a TFR element. A TFR contact etch forms contact openings over the TFR element, and a metal layer is formed to form metal layer connections to the IC element contacts and the TFR element. The sloped edges of the dielectric cap may improve the removal of metal adjacent the TFR element to prevent electrical shorts in the completed device. A TFR anneal to reduce a TCR of the TFR is performed at any suitable time before forming the metal layer.

13 Claims, 16 Drawing Sheets

(56) References Cited

U.S. PATENT DOCUMENTS

2010/0295149 A1 11/2010 Summerfelt et al. ......... 257/529
2019/0392967 A1 12/2019 Leng et al.

* cited by examiner

THIN FILM RESISTOR (TFR) FORMED IN AN INTEGRATED CIRCUIT DEVICE USING WET ETCHING OF A DIELECTRIC CAP

RELATED APPLICATION

This application claims priority to commonly owned U.S. Provisional Patent Application No. 62/982,107 filed Feb. 27, 2020, the entire contents of which are hereby incorporated by reference for all purposes.

TECHNICAL FIELD

The present disclosure relates to forming thin film resistors, e.g., systems and methods for forming a thin film resistor integrated in a semiconductor integrated circuit (IC) device.

BACKGROUND

Many integrated circuit ("IC") devices incorporate thin film resistors (TFRs), which provide various advantage over other types of resistors. For example, TFRs may be highly accurate, and may be finely tuned to provide a very precise resistance value. As another example, TFRs typical have smaller parasitic components which provides advantageous high frequency behavior. In addition, TFRs typically have a low temperature coefficient of resistance (TCR), e.g., after a suitable annealing process to "tune" the TCR to a near-zero value, which may provide stable operation over a wide range of operating temperatures. A TFR anneal may be performed at above 500° C., e.g., in the range of 500-525° C., to optimize the TCR value.

A TFR may include any suitable resistive film formed on, or in, an insulating substrate. Some common IC-integrated TFR resistive film materials include SiCr, SiCCr, TaN, and TiN, although any other suitable materials may be used. Fabricating integrated TFRs typically requires the addition of numerous processing to the background IC integration flow, such as several expensive photomask processes. It would be advantageous to reduce the number of such steps, in particular the number of photomask processes, to reduce the cost of integrated TFR fabrication Another problem relates to forming and annealing TFRs in IC devices that use aluminum interconnect layers (e.g., interconnect layers formed from aluminum, aluminum copper, or aluminum silicon copper), due to the relatively low melting point of aluminum. A common aluminum interconnect layer is formed as a layer stack, for example, a Ti layer, followed by a TiN layer, followed by an AlSiC layer (or AlCu or Al layer), followed by a second Ti layer, and finally a second TiN layer. A typical TFR anneal, which may involve temperatures at or above 500° C., may negatively affect such an aluminum interconnect, which has an accepted anneal temperature limit of about 450° C. For example, in an aluminum interconnect layer stack described above, when a TFR if formed and annealed (e.g., at a temperature at or above 500° C.) after forming an aluminum interconnect, $TiAl_3$ may form at grain boundaries within the interconnect layer stack, which increases sheet resistance of the interconnect (e.g., by a factor of 50 or more), which may cause electromigration problems in the IC structure.

SUMMARY

Embodiments of the present invention address various problems with conventional TFR integrations by forming a thin film resistor (TFR) after forming IC elements (e.g., memory devices) and contacts (e.g., tungsten vias), but before forming a first metal/interconnect layer, often referred to as a "Metal 1" layer. By forming the TFR prior to forming the Metal 1 layer, a TFR anneal may be performed at temperatures that would negatively affect the material of the Metal 1 layer, for example where aluminum (or other metal have a low melting temperature) is used for the Metal 1 layer. Thus, forming the TFR prior to forming the Metal 1 layer (e.g. aluminum Metal 1 layer) allows a TFR anneal at optimal temperature (e.g., to optimize a TCR value of the TFR film), for example an anneal at or above 500° C. (e.g., in the range of 500-525° C.). Thus, embodiments of the present invention allow formation and optimal annealing of a TCR in an IC production flow that utilizes aluminum interconnect.

As used herein, "forming" any particular material layer (or other structure) may include depositing the respective material layer, growing the respective material layer (e.g., growing an oxide layer), or otherwise forming the respective material layer, and may include various process steps known in the art with respect to forming various types of layers in an IC structure.

In addition, as used herein, an "etch process" may include a single etch, or multiple etches that may include different etch chemistries or other etch parameters.

In some embodiments, the process of forming the TFR includes only two added photomasks to the background IC production flow (i.e., the IC production flow without forming the TFR).

In some embodiments the disclosed process of forming an TFR in an IC device includes forming a cap oxide layer over a TFR film (e.g., SiCCr film) and performing a wet etch to remove portions of the cap oxide layer, thereby forming an oxide cap over the TFR film. The wet etch (as compared to a dry etch) may form sloped (i.e., non-vertical) lateral edges of the oxide cap over the TFR film. The sloped edges of the oxide cap may facilitate (e.g., make easier) the removal of metal (e.g., portions of the deposited Metal 1 layer) adjacent the TFR element to prevent electrical shorts (often referred to as "stringers") in the completed device.

In one aspect of the invention, a method is provided for forming an integrated thin film resistor (TFR) in a semiconductor integrated circuit device. An integrated circuit (IC) structure is formed, including a plurality of IC elements and a plurality of conductive IC element contacts connected to the plurality of IC elements. A TFR film layer is formed over the IS structure, and a TFR dielectric layer is formed over the TFR film layer. A wet etch is performed to remove selected portions of the TFR dielectric layer, thereby leaving a TFR dielectric cap over the TFR film layer, wherein the wet etch stops at the TFR film layer, and wherein the wet etch defines sloped lateral edges of the TFR dielectric cap. A TFR etch is performed to remove selected portions of the TFR film layer (e.g., those not under the TFR dielectric cap), to thereby define a TFR element, wherein the sloped lateral edges of the TFR dielectric cap are aligned over respective lateral edges of the TFR element. A TFR contact etch is then performed to form TFR contact openings in the TFR dielectric cap over the TFR element, and a metal layer (e.g., "Metal 1" layer) is deposited over the conductive IC element contacts and over the TFR dielectric cap, and extending into the TFR contact openings and in contact with the TFR element.

A TFR anneal is performed at some time after forming the TFR film layer but before depositing the metal layer, e.g., to reduce a thermal coefficient of resistance (TCR) of the TFR film layer. For example, a TFR anneal may be performed after forming the TFR film layer and TFR dielectric layer but before the wet etch to define the TFR dielectric cap, or may be performed after the TFR etch that defines the TFR element, or at any other time after forming the TFR film layer but before depositing the metal layer.

In some embodiments, the step of forming the metal layer includes depositing a conformal layer of metal over the TFR dielectric cap, and performing a metal etch to remove selected portions of the conformal layer of metal. The deposited conformal layer of metal includes a sloped metal region extending over a respective sloped lateral edge of the TFR dielectric cap, which sloped metal region has a lower height at a first location adjacent a respective lateral edge of the TFR element than at a second location above a top upper surface of the TFR dielectric cap. The metal etch to remove selected portions of the conformal layer of metal includes removing a portion of the sloped metal region at the first location adjacent the respective lateral edge of the TFR element. The lower height of the sloped metal region at the first location may allow a reduced etching time or intensity to remove the full thickness of the sloped metal region at the first location, e.g., as compared with a similar structure in which the TFR dielectric cap has vertical lateral edges (i.e., squared-off edges) instead of sloped lateral edges created by the wet etch of the TFR dielectric layer.

In one embodiment, the integrated circuit structure includes a memory cell or transistor structure including at least one conductive IC element contact connected to at least one of a source region, a drain region, and a gate region of the memory cell or transistor structure.

In some embodiments, the TFR film layer comprises silicon carbide chromium (SiCCr), silicon chromium (SiCr), chromium silicon nitride (CrSiN), tantalum nitride (TaN), tantalum silicide ($Ta_2Si$), or titanium nitride (TiN).

In one embodiment, the metal interconnect layer comprises aluminum.

In one embodiment, the TFR dielectric layer comprises an oxide layer.

In one embodiment, an etch stop layer is formed over the IC structure prior to forming the TFR film layer, such that the TFR film layer is formed over the etch stop layer.

In one embodiment, the TFR etch comprises a dry etch.

In one embodiment, the TFR anneal comprise an anneal at a temperature of at least 500° C. For example, the TFR anneal may comprise an anneal at a temperature of 515° C.±10° C. for a duration of 15-60 minutes (e.g., 30 min).

In another aspect of the invention, a method is provided for forming an integrated thin film resistor (TFR) in a semiconductor integrated circuit device. An integrated circuit (IC) structure is formed, including a plurality of IC elements and a plurality of conductive IC element contacts connected to the plurality of IC elements. A first etch stop layer is formed over the IC structure. A TFR film layer is formed over the first etch stop layer, and a TFR dielectric layer is formed over the TFR film layer. A first photomask is formed and patterned over a portion of the TFR dielectric layer. A first etch process is performed to remove exposed portions of the TFR dielectric layer, thereby leaving a TFR dielectric cap under the first photomask and over the TFR film layer. The first etch process may comprise a wet etch that stops at the TFR film, and the wet etch may define sloped lateral edges of the TFR dielectric cap, e.g., as discussed above. A second, dry etch is performed to remove exposed portions of the TFR film layer to thereby define a TFR element. A second photomask is formed and patterned with at least one second mask opening aligned over the TFR element. A third etch process is performed to form at least one TFR contact opening in the TFR dielectric cap over the TFR element. A metal interconnect layer (e.g., "Metal 1" layer) is formed over the plurality of conductive IC element contacts and over the TFR dielectric cap and underlying TFR element, such that the formed metal interconnect layer extends into the at least one TFR contact opening to contact the underlying TFR element. A third photomask is formed and patterned. Finally, a fourth etch process is performed to remove selected portions of the metal interconnect layer to thereby define a plurality of metal interconnect elements.

A TFR anneal is performed at some time after forming the TFR film layer but before forming the metal interconnect layer, e.g., to reduce a thermal coefficient of resistance (TCR) of the TFR film layer. For example, a TFR anneal may be performed before or after the first etch process, before or after the second etch process, before or after the third etch process, or at any other time after forming the TFR film layer but before forming the metal interconnect layer.

In some embodiments, as discussed above, the sloped lateral edges of the TFR dielectric may facilitate (e.g., make easier) the removal of metal (e.g., portions of the deposited Metal 1 layer) adjacent the TFR element to prevent electrical shorts (often referred to as "stringers") in the completed device.

In one embodiment, the integrated circuit structure includes a memory cell or transistor structure including at least one conductive IC element contact connected to at least one of a source region, a drain region, and a gate region of the memory cell or transistor structure.

In some embodiments, the TFR film layer comprises silicon carbide chromium (SiCCr), silicon chromium (SiCr), chromium silicon nitride (CrSiN), tantalum nitride (TaN), tantalum silicide ($Ta_2Si$), or titanium nitride (TiN).

In one embodiment, the metal interconnect layer comprises aluminum.

In one embodiment, the TFR dielectric layer comprises an oxide layer.

In one embodiment, the TFR anneal is performed prior to forming the metal interconnect layer.

In some embodiments, the TFR anneal comprise an anneal at a temperature in the range of 500-525° C. For example, in some embodiments the TFR anneal comprise an anneal at a temperature of 515° C.±10° C. for a duration of 15-60 minutes (e.g., 30 min).

In one embodiment, the third etch process comprises a wet etch. In another embodiment, the third etch process comprises a dry etch.

In one embodiment, the fourth etch process defines a TFR interconnect element providing a conductive connection between the TFR element and at least one of the plurality of conductive IC element contacts.

In another aspect, a semiconductor device including a thin film resistor (TFR) produced according to the disclosed process is provided.

BRIEF DESCRIPTION OF THE DRAWINGS

Example aspects of the present disclosure are described below in conjunction with the figures, in which:

FIGS. 13A-13C show a removal of selected portions of a metal layer deposited over a TFR oxide cap having sloped lateral edges, while FIGS. 14A-14C show a removal of selected portions of a metal layer deposited over a TFR oxide cap having vertical ("squared-off") lateral edges.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION OF THE INVENTION

Embodiments of the present invention provide an improved technique for integrating a thin film resistor (TFR) in a semiconductor integrated circuit (IC) device, which may provide a cost reduction as compared with conventional techniques, e.g., by allowing for TFR integration in combination with aluminum interconnect. In some embodiments, the TFR is formed after IC elements and IC element contacts (e.g. tungsten vias) are formed, but before the first metal/interconnect layer ("Metal 1" layer) is formed. This may allow a TFR anneal to be performed (e.g., to optimize the TCR value of the TFR film), for example at a temperature of 500° C. or above (e.g., in the range of 500-525° C.). Thus, an annealed TFR may be integrated into an IC device that uses aluminum interconnect, because the aluminum interconnect (which is generally not tolerant of the high temperatures experienced during a typical TFR anneal) is not formed until after the TFR anneal.

Further, in some embodiments, the TFR may include an oxide cap formed over a TFR element (e.g., SiCCr element), wherein the cap oxide includes sloped lateral edges aligned over lateral edges of the TFR element, which may prevent or reduce the occurrence of electrical shorts (often referred to as "stringers") between the TFR element and adjacent metal structures (e.g., Metal 1 structures) during operation of the IC device. In some embodiments, the cap oxide with sloped lateral edges may be formed by forming a cap oxide layer over a TFR film and performing a wet etch to define an oxide cap having sloped lateral edges.

FIGS. 1-12 illustrate an example method of integrating a thin film resistor (TFR) in a semiconductor integrated circuit (IC) device, according to an example embodiment.

Figure 1:
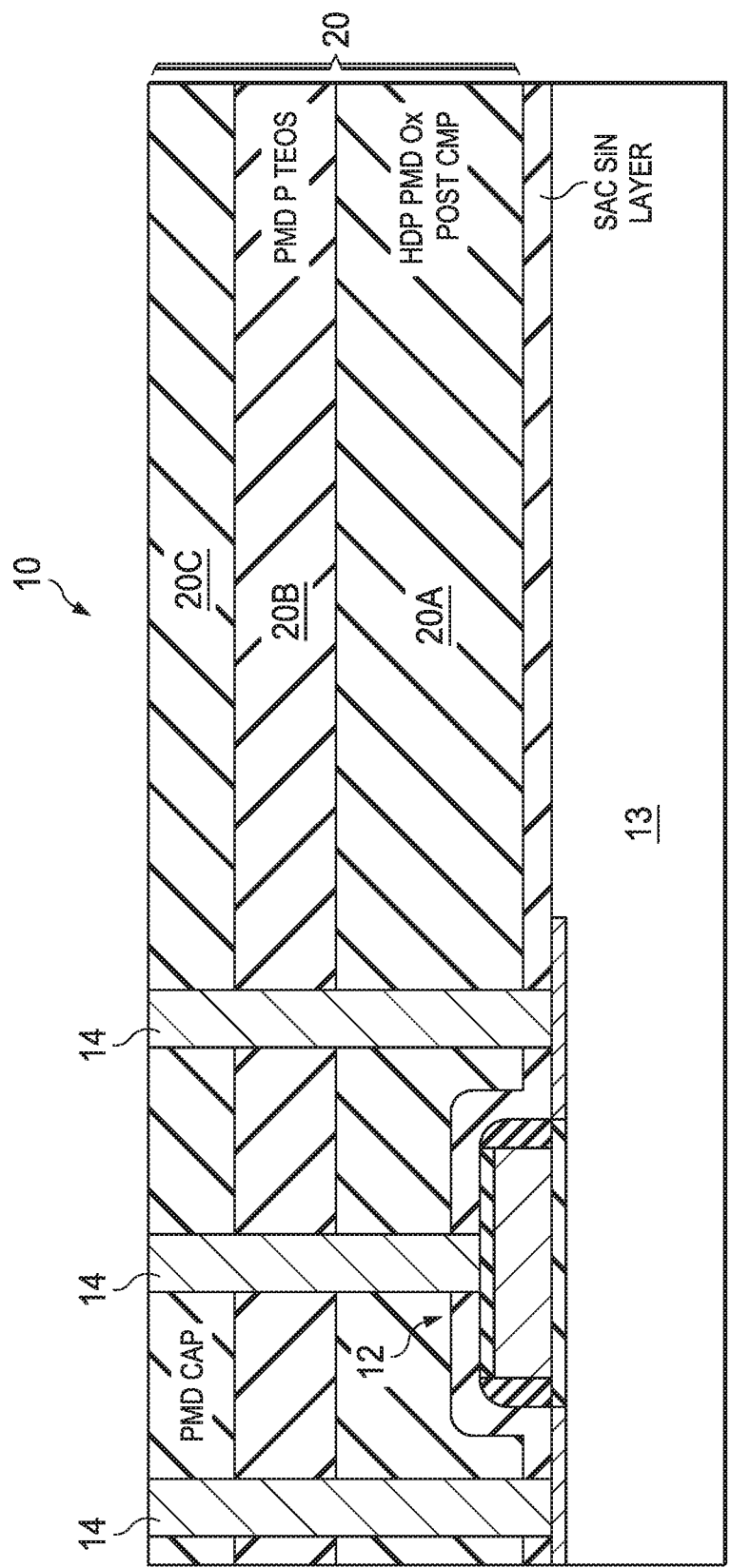
FIGS. 1-12 illustrate steps of an example method of integrating a thin film resistor (TFR) in a semiconductor integrated circuit (IC) device, according to one example embodiment of the invention.

FIG. 1 illustrates an example integrated circuit (IC) structure 10, e.g., during the manufacturing of an IC device. In this example, the IC structure 10 includes a transistor structure 12 formed over a substrate 13, with a plurality of conductive contacts 14, e.g., tungsten vias, extending though a bulk insulation region 20 formed over the transistor structure 12. However, the IC structure 10 may include any other IC devices(s) or structure(s), e.g., one or more full, or partial, memory cells or memory cell structures, and conductive contacts associated with such structures. In this example embodiment, the bulk insulation region 20 includes (a) a high-density plasma (HDP) pre-metal dielectric (PMD) oxide layer 20A (e.g., formed after a CMP), (b) a PMD oxide film 20B, e.g., PMD P TEOS (phosphorous-doped tetraethyl orthosilicate film), and (c) a PMD cap layer 20C.

FIG. 1 may represent a state during an IC fabrication process after formation of tungsten vias 14 and a chemical mechanical polish (W CMP) process at the top of the structure 10.

Figure 2:
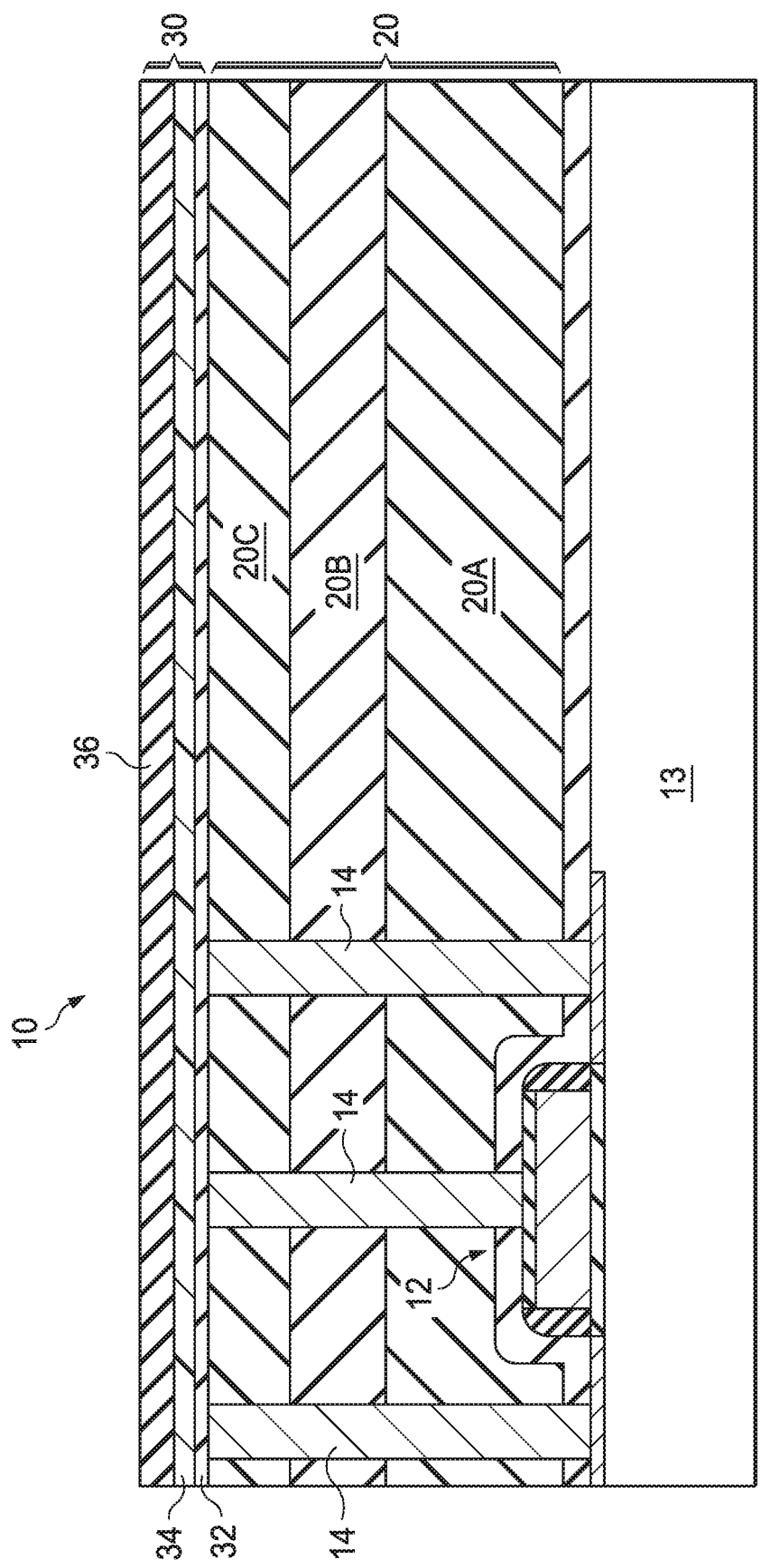

Next, as shown in FIG. 2, a TFR layer stack 30 is formed over the bulk insulation region 20 and conductive contacts 14. First, a dielectric etch stop layer 32, e.g., an SiN layer, may be formed, e.g., to protect the tungsten vias 14 from a subsequent TFR etch shown below at FIG. 5. A thin resistive film layer (TFR film layer) 34 may then be formed on the first dielectric etch stop layer 32. The TFR film layer 34 may comprise, SiCCr, SiCr, TaN, TiN, or any other suitable TFR material.

In some embodiments, a TFR anneal may be performed at this point, e.g., to tune or optimize a temperature coefficient of resistance (TCR) of the TFR film layer 34. For example, an anneal may be performed at a temperature of ≥500° C. In some embodiments, the TFR anneal may comprise an anneal at 515° C.±10° C. for a duration of 15-60 minutes, e.g., 30 min. In other embodiments, the TFR anneal may be performed at any other point in the process, prior to the deposition of the first metal layer/interconnect layer 60 (e.g., "Metal 1" layer) discussed below with reference to FIG. 10. For example, in some embodiments, the TFR anneal may be performed after forming the TFR contact dielectric layer 36 discussed below with respect to FIG. 2. In other embodiments, the TFR anneal may be performed after etching the TFR film layer 34 to define a TFR element 34A, as discussed below with respect to FIGS. 5 and 6. In other embodiments, the TFR anneal may be performed after performing a TFR contact etch, as described below with respect to FIG. 9.

After the TFR anneal, a TFR contact dielectric layer 36 may be formed on the TFR film layer 34. In this embodiment, TFR contact dielectric layer 36 comprises an oxide layer.

Figure 3:
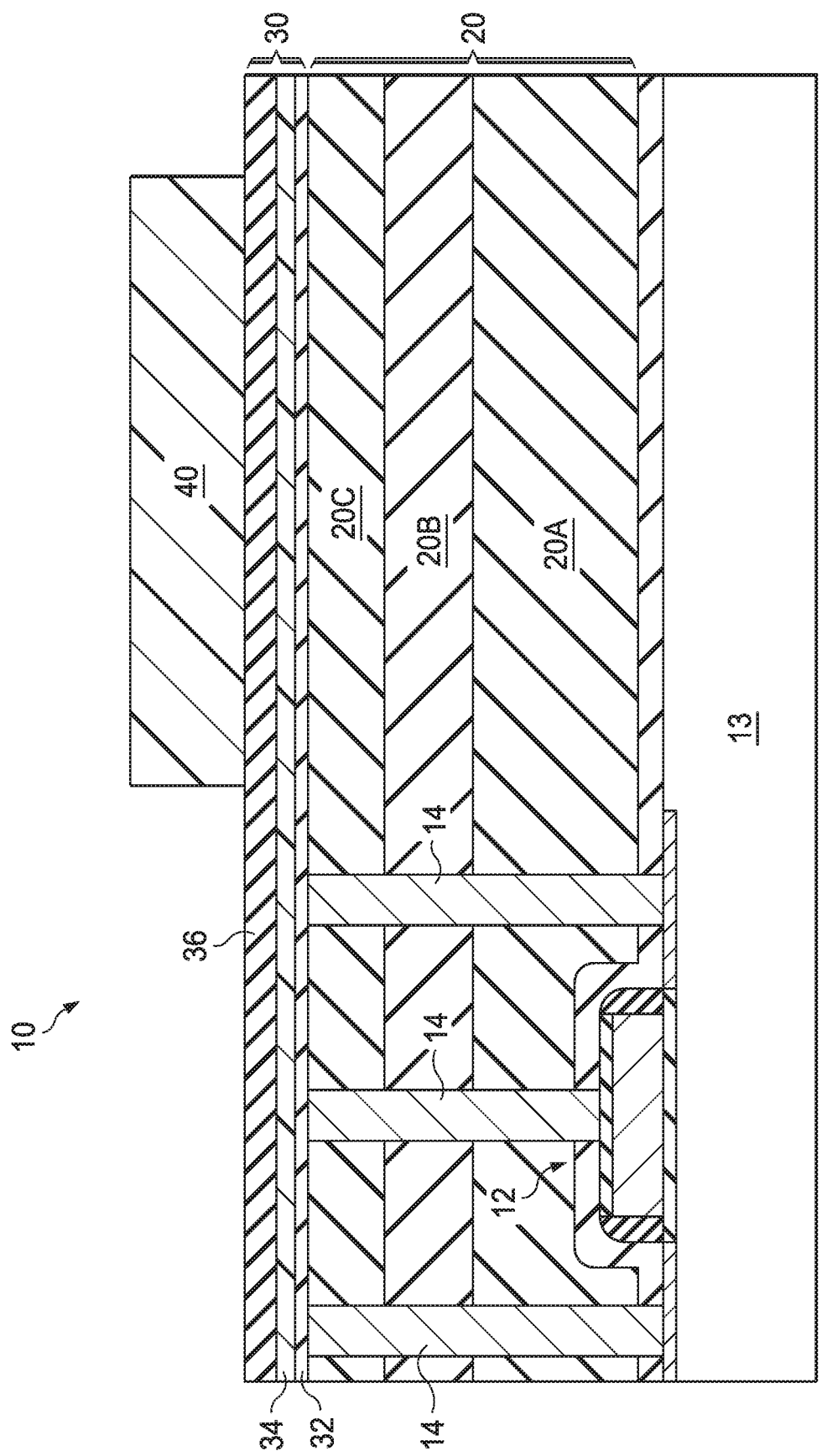

As shown in FIG. 3, a first photomask 40 may be formed and patterned (e.g., using known photolithographic techniques) for forming a TFR, in this example at a location laterally offset from the underlying transistor structure 12.

Figure 4:
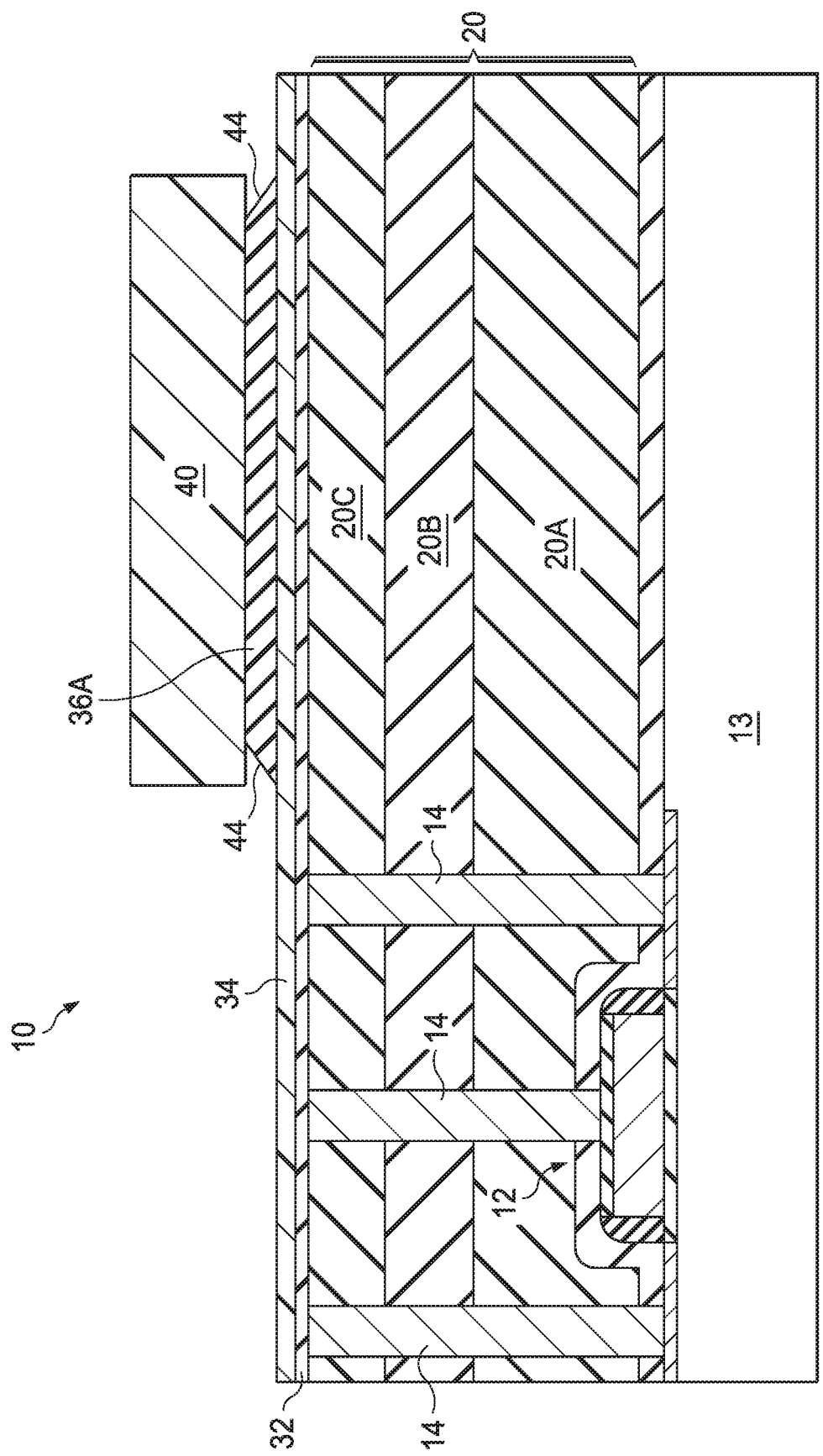

As shown in FIG. 4, a wet etch may then be performed to remove exposed portions of the TFR oxide layer 36 to define an oxide cap 36A under the photomask 40 and over the TFR film layer 34. As shown, the wet etch may be designed to stop at the TFR film layer 34, and may define sloped (i.e., non-horizontal and non-vertical) lateral edges 44 of the TFR oxide cap 36A.

Figure 5:
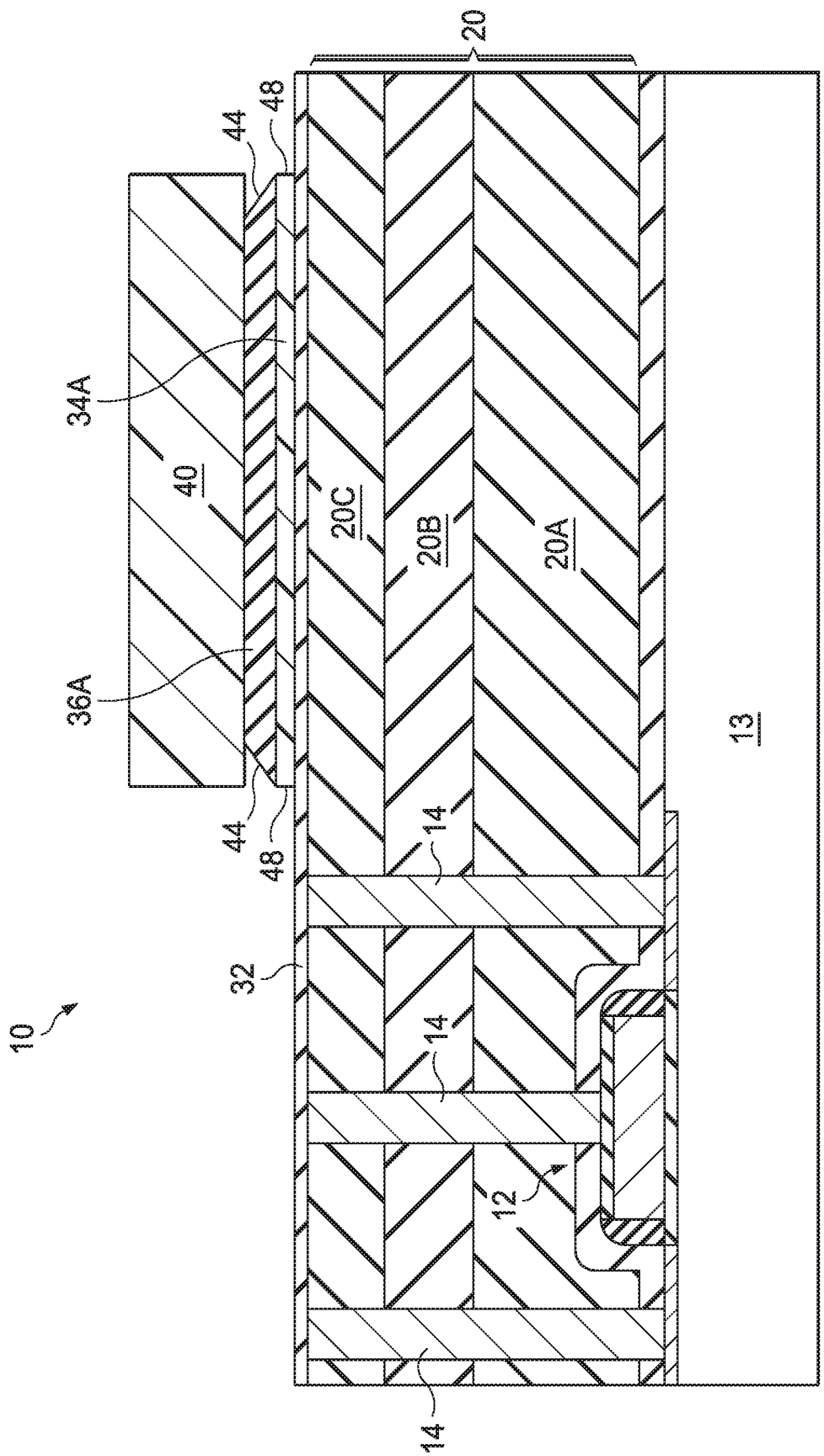

As shown in FIG. 5, a dry etch may then be performed to remove exposed portions of the TFR film layer 34, to thereby define a TFR element 34A under the oxide cap 36A. The dry etch may be designed to stop on the SiN etch stop layer 32. As shown, the sloped lateral edges 44 of the TFR oxide cap 36A, formed by the wet etch discussed above, are aligned over corresponding lateral edges 48 of the TFR element 34A. As discussed below, e.g., with respect to FIGS. 13A-13C and 14A-14C, the sloped lateral edges 44 of the TFR oxide cap 36A may facilitate the removal of selected portions of a deposited metal layer 60 adjacent the TFR element 34A to prevent electrical shorts (often referred to as "stringers") in the completed device.

Figure 6:
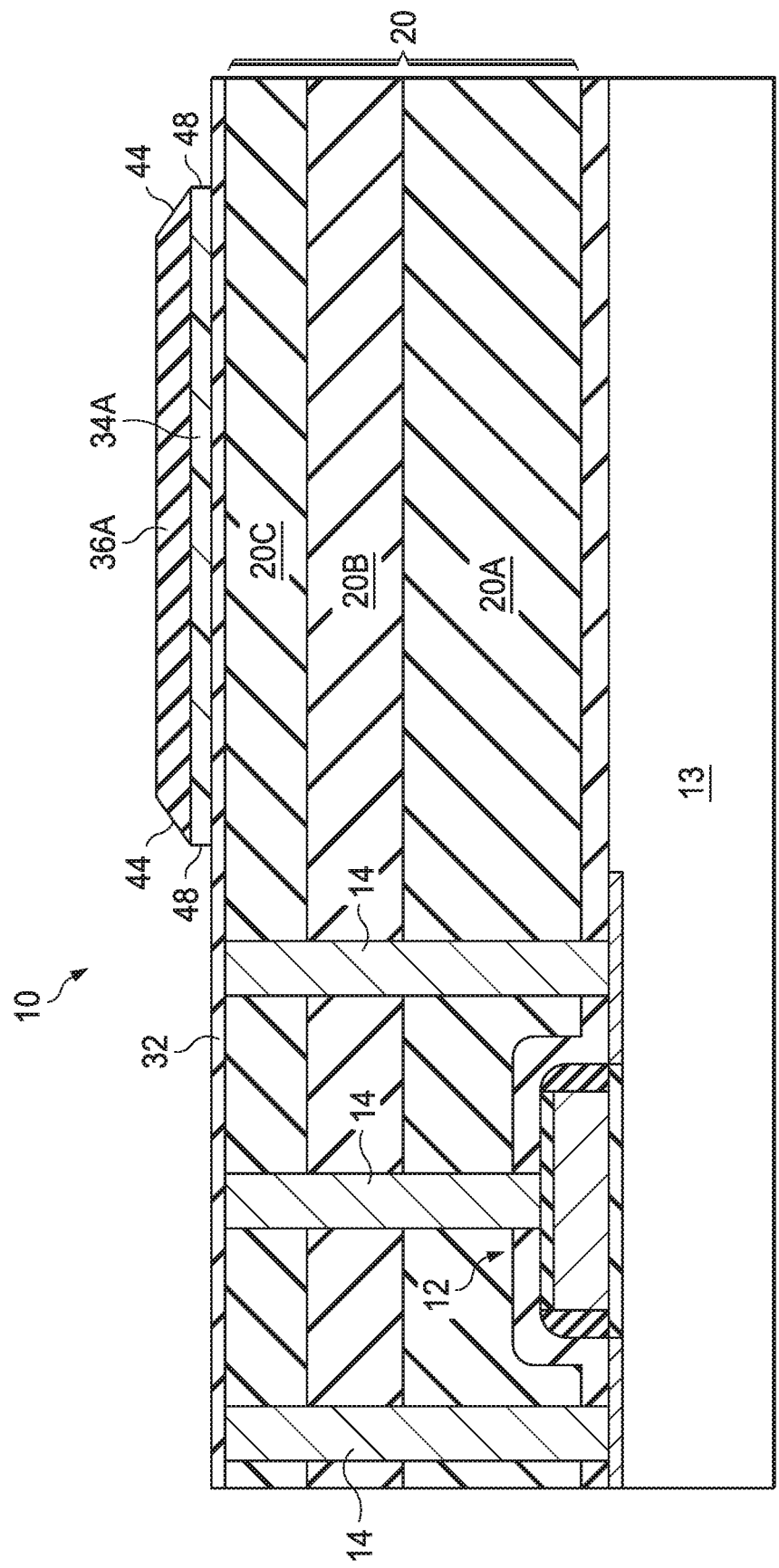

As shown in FIG. 6, the remaining portions of the photoresist 40 may be stripped. In some embodiments, a chemical clean may be used because the underlying tungsten contacts 14 are protected by the SiN etch stop layer 32.

Figure 7:
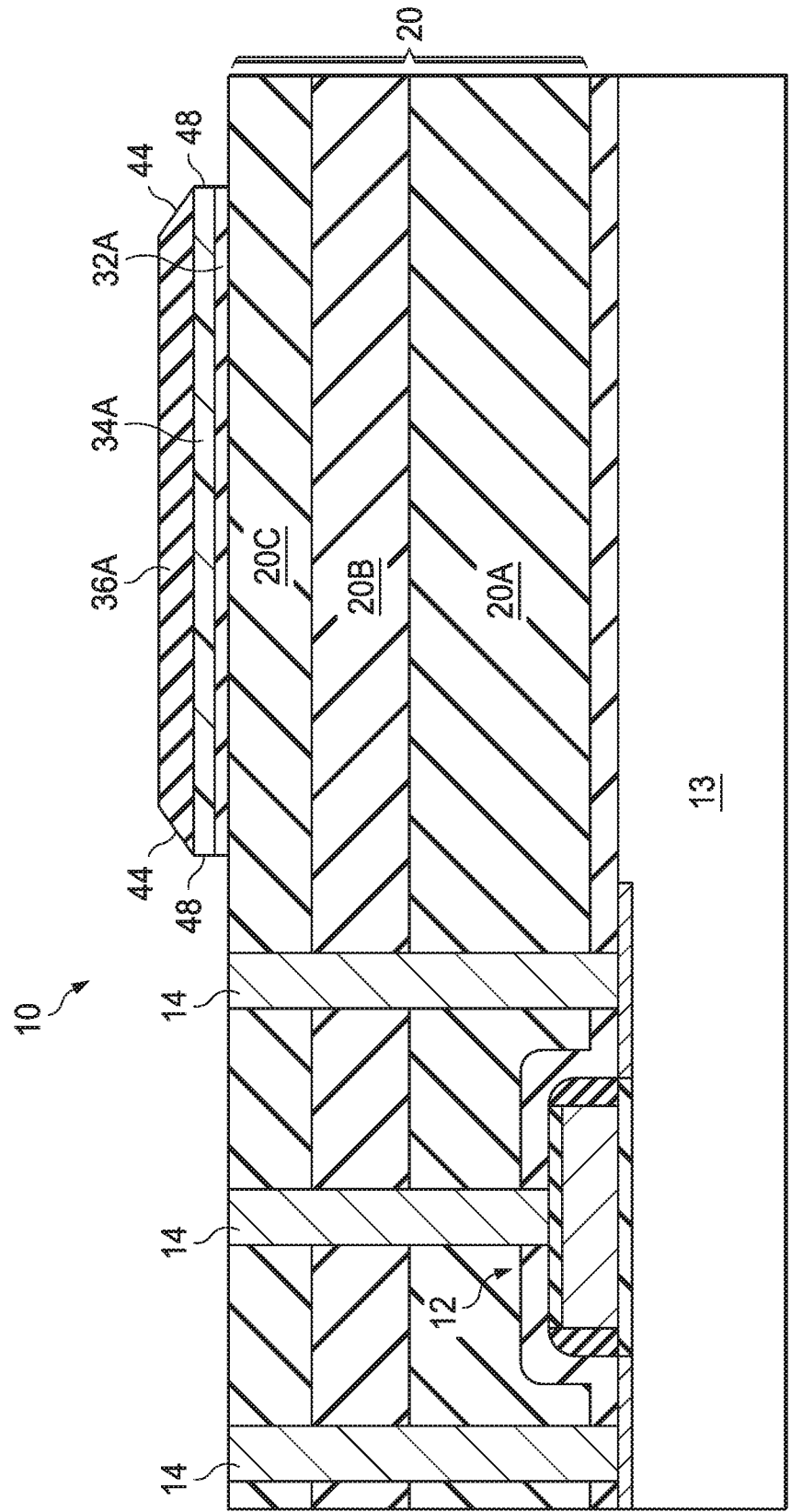

As shown in FIG. 7, exposed portions of the SiN etch stop layer 32 may be removed, e.g., by performing a gentle SiN clear etch, preferably with high selectivity to oxide, to thereby protect the underlying tungsten contacts 14. A remaining portion of the SiN etch stop layer 32, below the TFR element 34A, is indicated at 32A.

Figure 8:
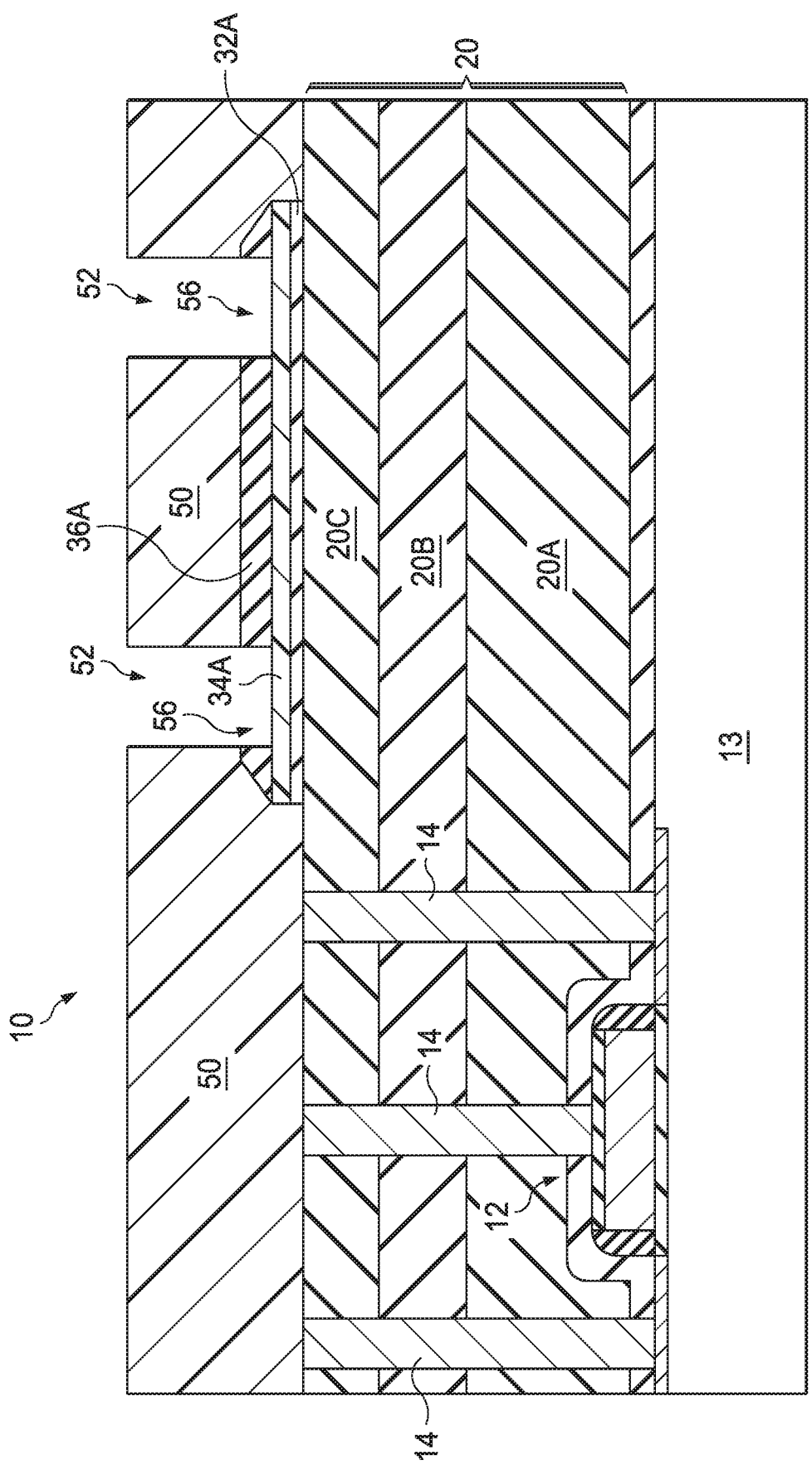

As shown in FIG. 8, a second photomask 50 may then be formed and pattered to define a pair of mask openings 52 aligned over the TFR element 34A. A TFR contact etch may then be performed to define a pair of TFR contact openings 56 in the TFR oxide cap 36A, stopping on the TFR element 34A, such that the TFR contact etch exposes upper surfaces of the TFR element 34A within the TFR contact openings 56. The TFR contact etch may be a wet etch or a dry etch. A wet etch may improve the flow of metal during a subsequent metal deposition (see FIG. 9), but may increase the size of the TFR contact openings 56.

Figure 9:
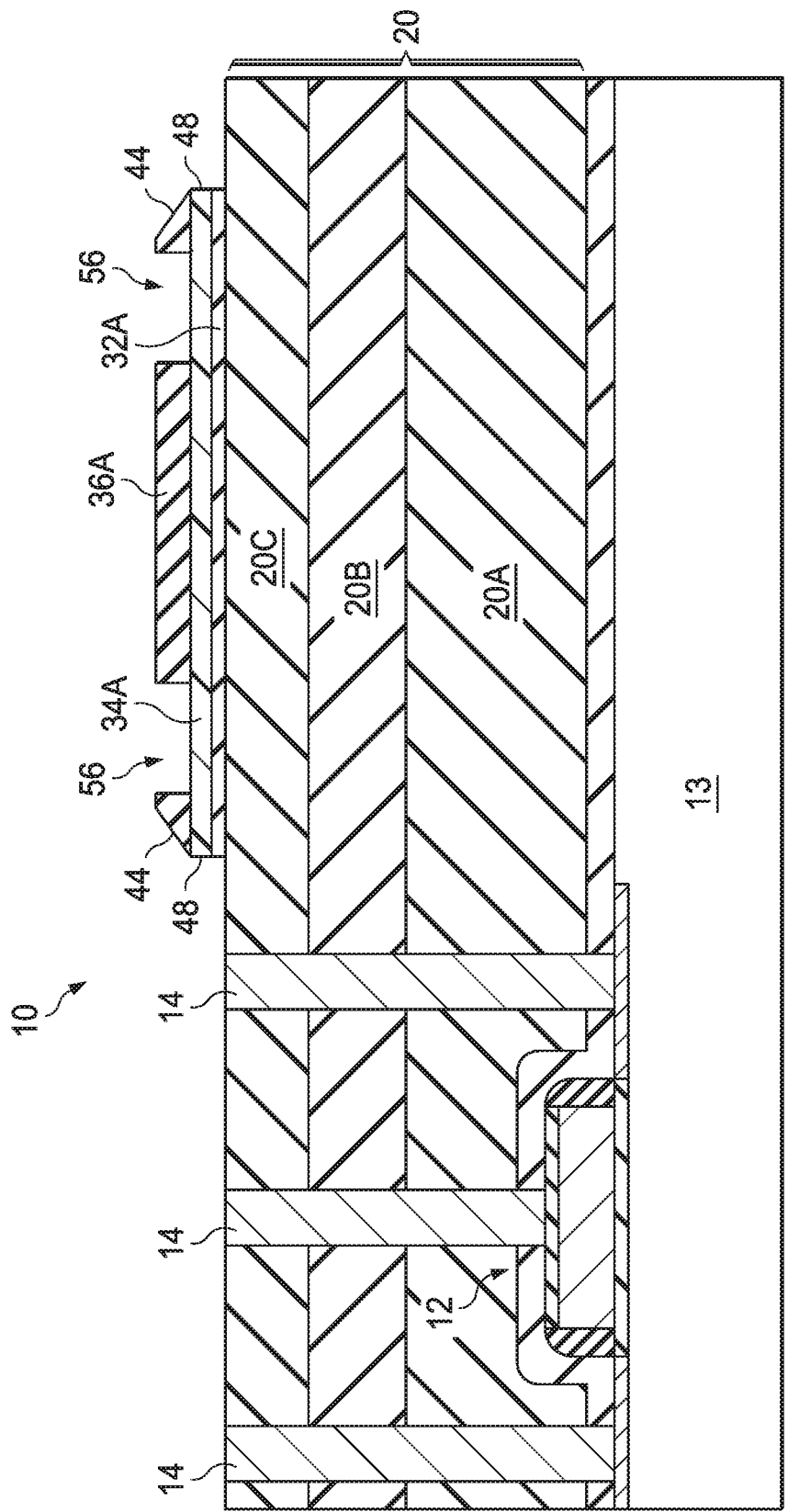

As shown in FIG. 9, the remaining portion of the second photomask 50 may be removed, e.g., by performing a resist strip.

Figure 10:
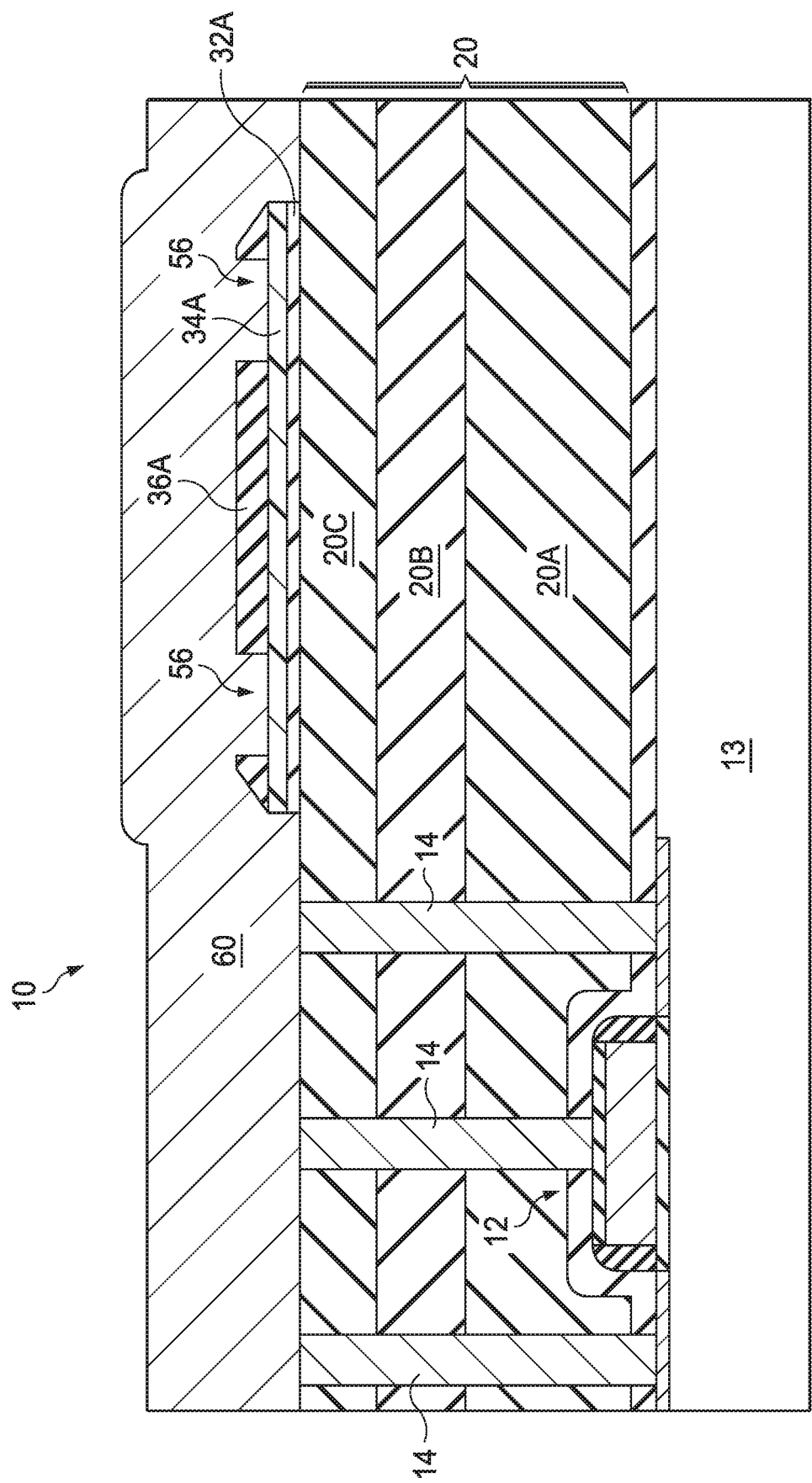

As shown in FIG. 10, the IC device processing may continue, by forming a first metal layer/interconnect layer, referred to as a "Metal 1" layer 60. In the illustrated embodiment, Metal 1 layer 60 comprises aluminum. In other embodiments, Metal 1 layer 60 may comprise copper or other metal. As shown, Metal 1 layer 60 extends into the TFR contact openings 56 formed in the TFR oxide cap 36A, to thereby contact the TFR element 34A at opposing sides of the TFR element 34A. Metal 1 layer 60 also extends over and in contact with tungsten contacts 14.

Figure 11:
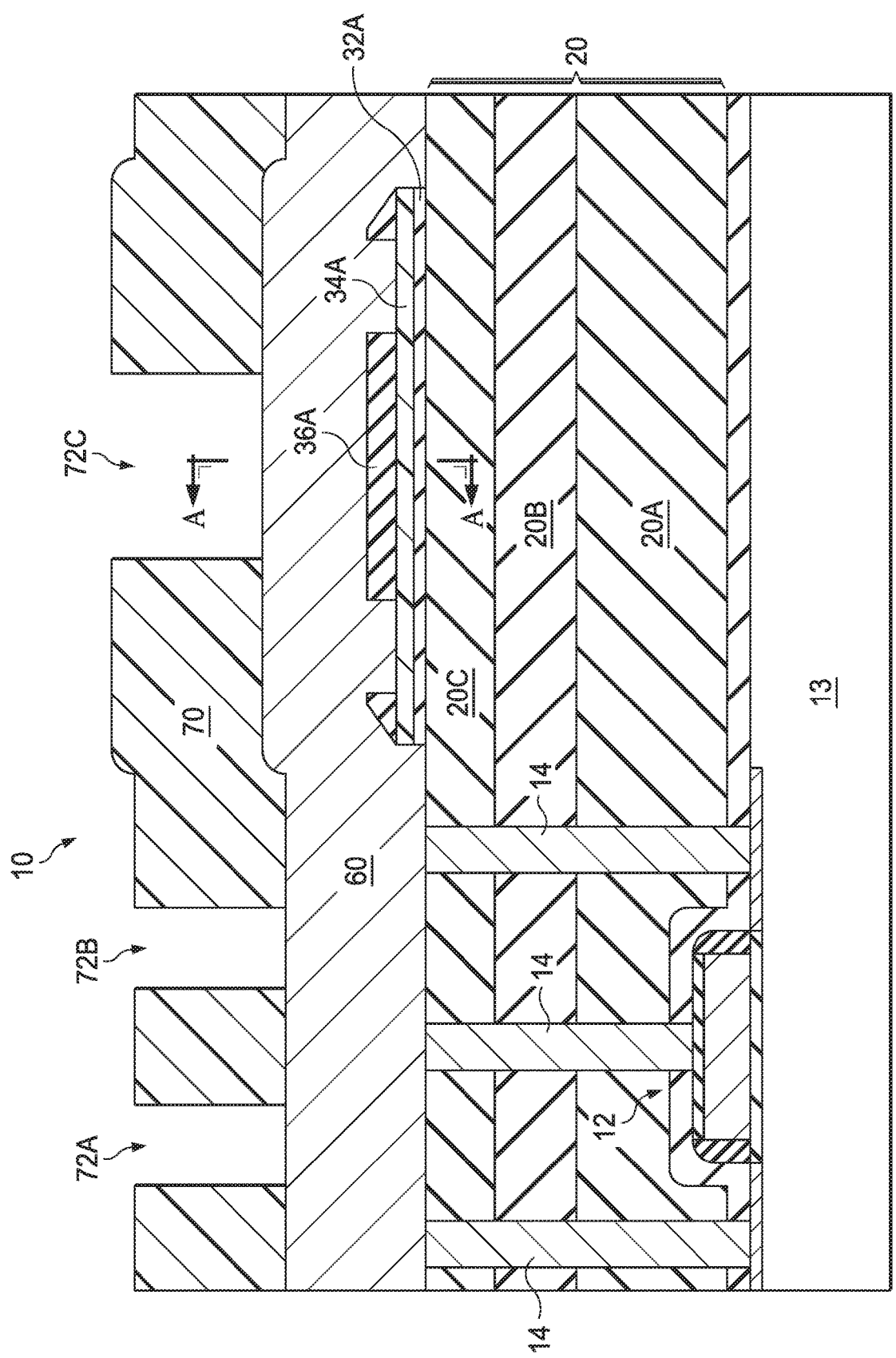

Next, as shown in FIG. 11, a third photomask 70 may be formed, patterned, and etched to define a plurality of mask openings 72A, 72B, 72C to pattern the underlying Metal 1 layer.

Figure 12:
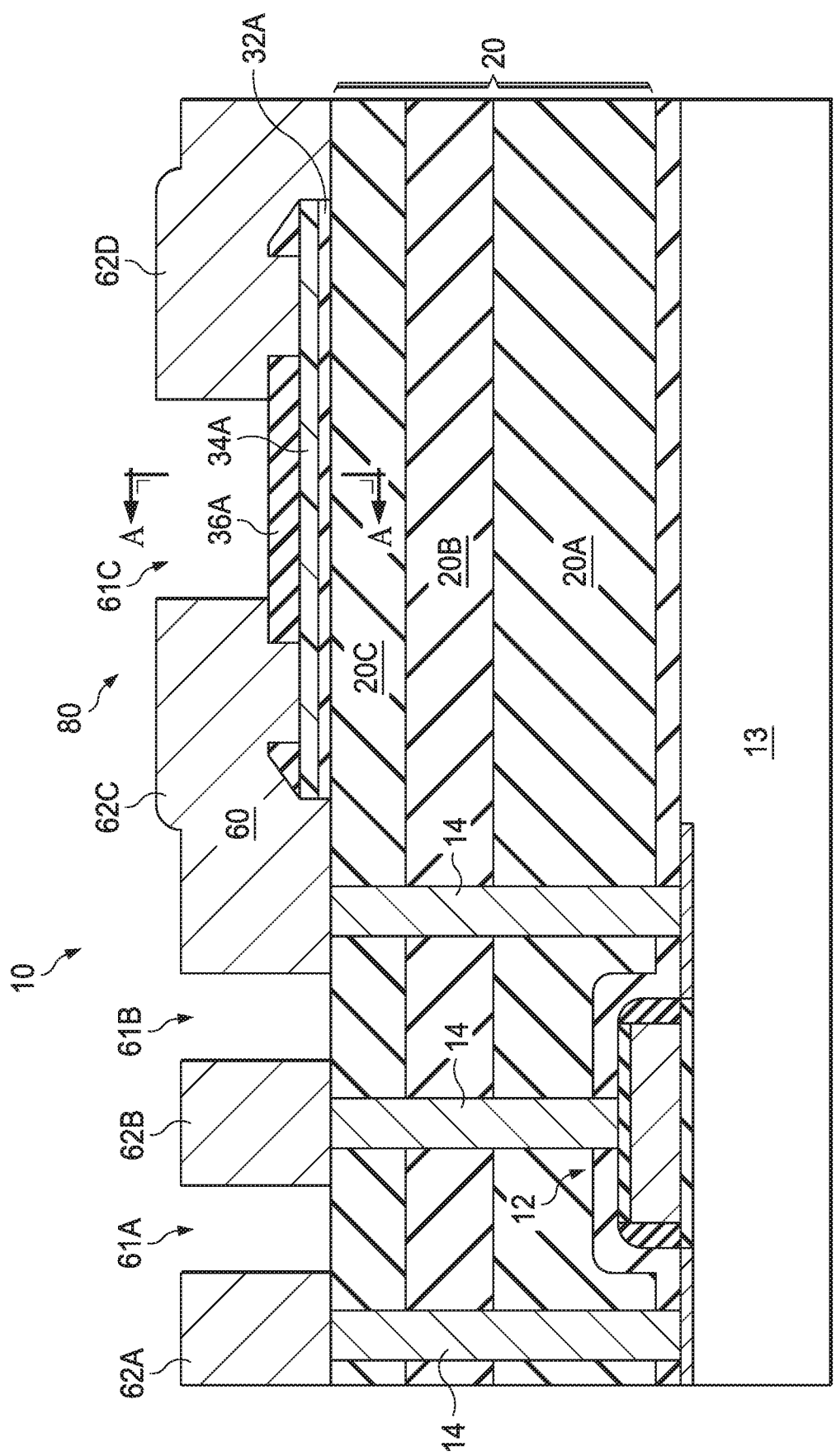

Finally, as shown in FIG. 12, a metal etch may be performed through mask openings 72A, 72B, 72C to etch selected portions of the aluminum Metal 1 layer 60 to define a plurality of metal layer openings 61A, 61B, 61C and aluminum Metal 1 elements (e.g., interconnect elements) 62A-62D. After the metal etch, the remaining photoresist material 70 may then be removed. For example, as shown, the metal etch may define aluminum interconnect elements 62A and 62B in contact with tungsten vias 14, and aluminum interconnect elements 62C and 62D in contact with the opposing sides of the TFR element 34A. In this example illustration, a first aluminum interconnect element 62C conductively connects a first side of the TFR element 34A with a tungsten via 14 coupled to a source or drain region of the transistor 12, and a second interconnect element 62D conductively contacts a second side of the TFR element 34A with other IC element structure(s) (not shown). The TFR element 34A and the first and second interconnect elements 62C and 62D collectively define an integrated TFR, indicated at 80.

As mentioned above, the sloped lateral edges 44 of the TFR oxide cap 36A may facilitate the removal of selected portions of metal layer 60 adjacent selected lateral edges of the TFR element 34A, e.g., to prevent an electrical short ("stringer") between interconnect elements 62C and 62D caused by a remaining portion of metal layer 60 (after the metal etch) that physically connects interconnect elements 62C and 62D, i.e., the metal contacts on opposing sides of the TFR element 34A.

Figure 13A:
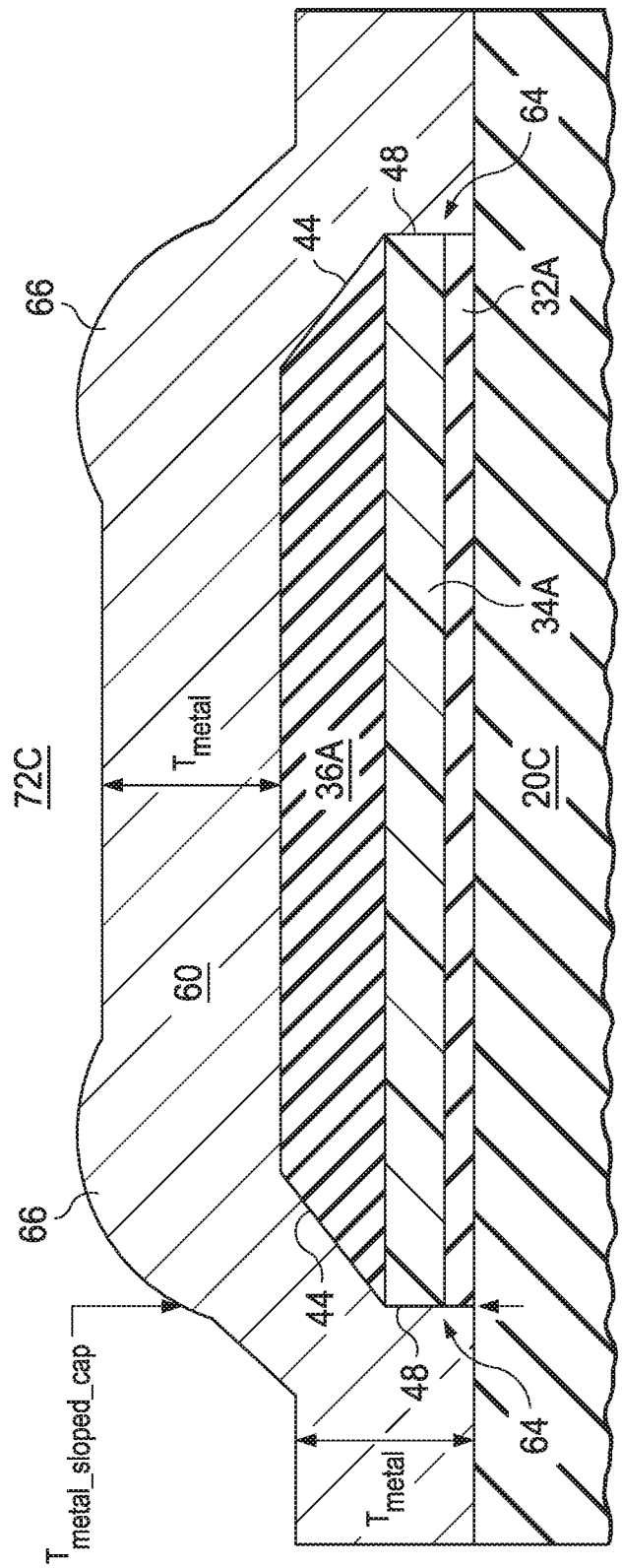
FIGS. 13A-13C and 14A-14C illustrate how sloped lateral edges of a TFR oxide cap can prevent or reduce the occurrence of electrical shorts (often referred to as "stringers") in an integrated TFR. More particularly.
Figure 13B:
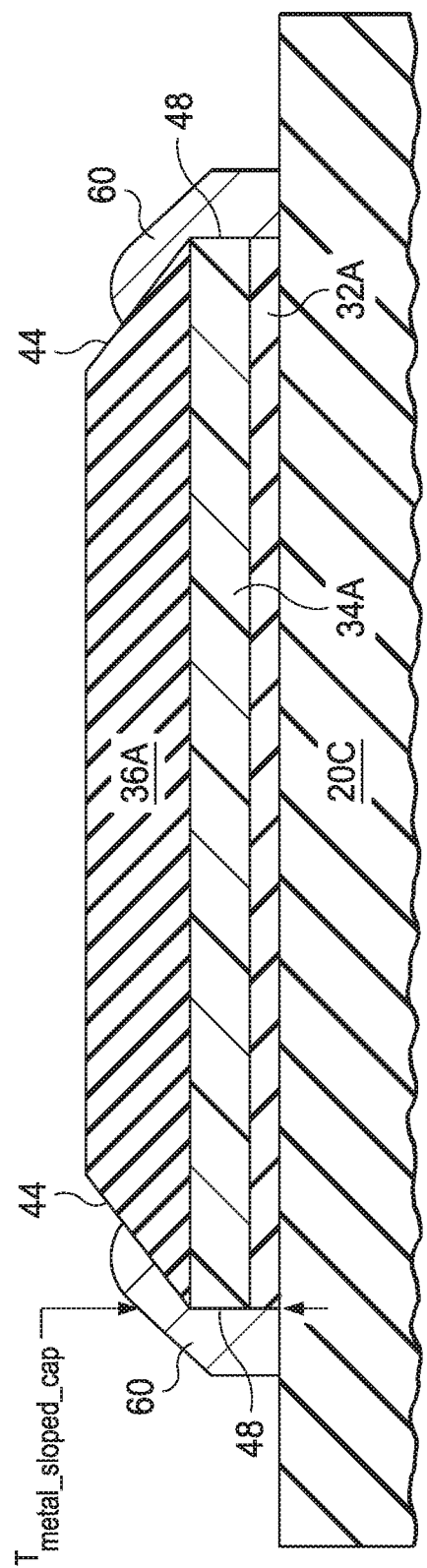
Figure 13C:
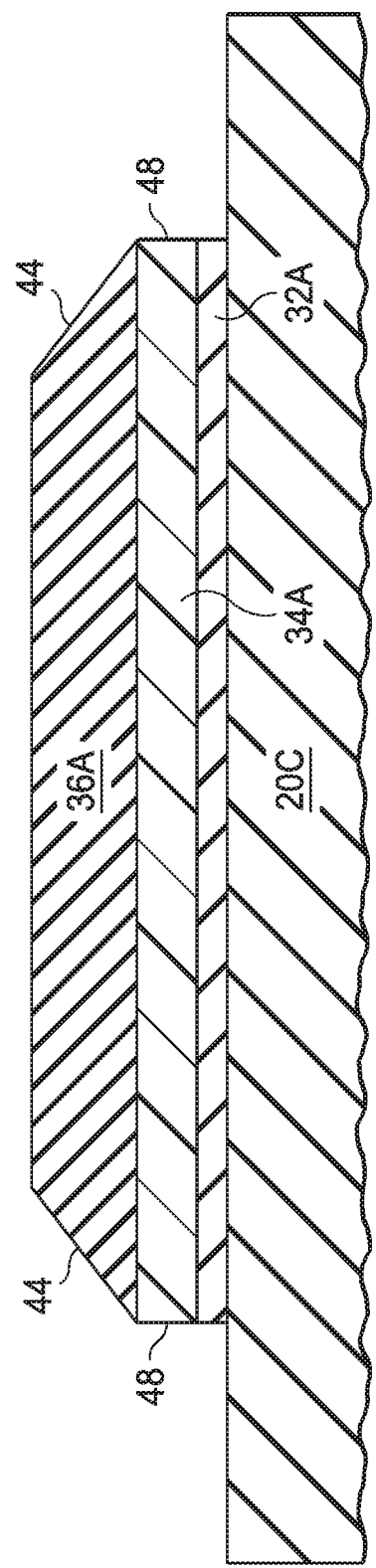
Figure 14A:
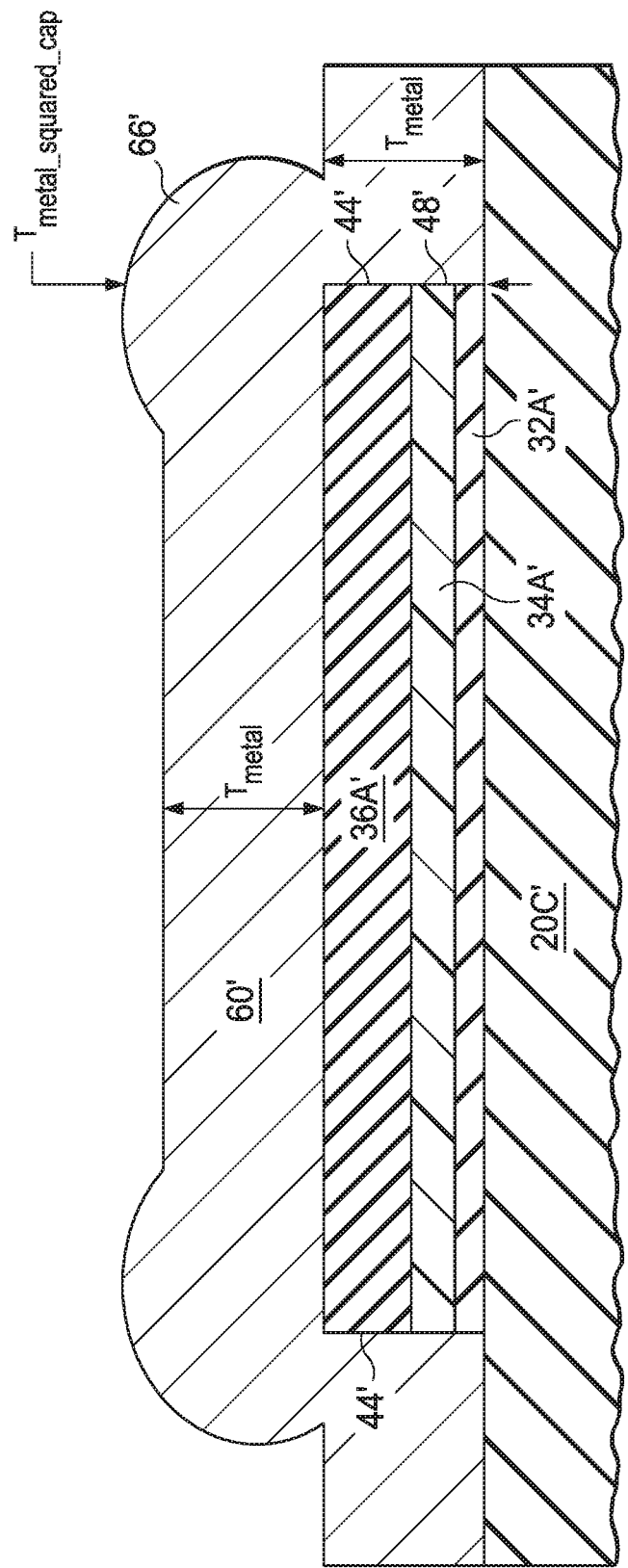
Figure 14B:
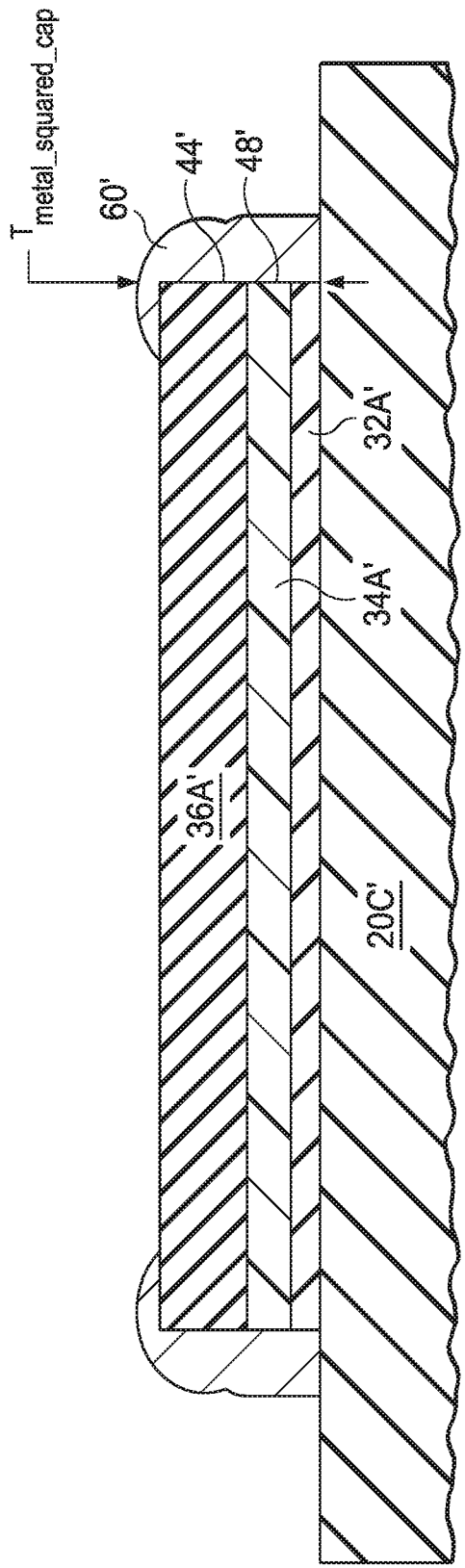
Figure 14C:
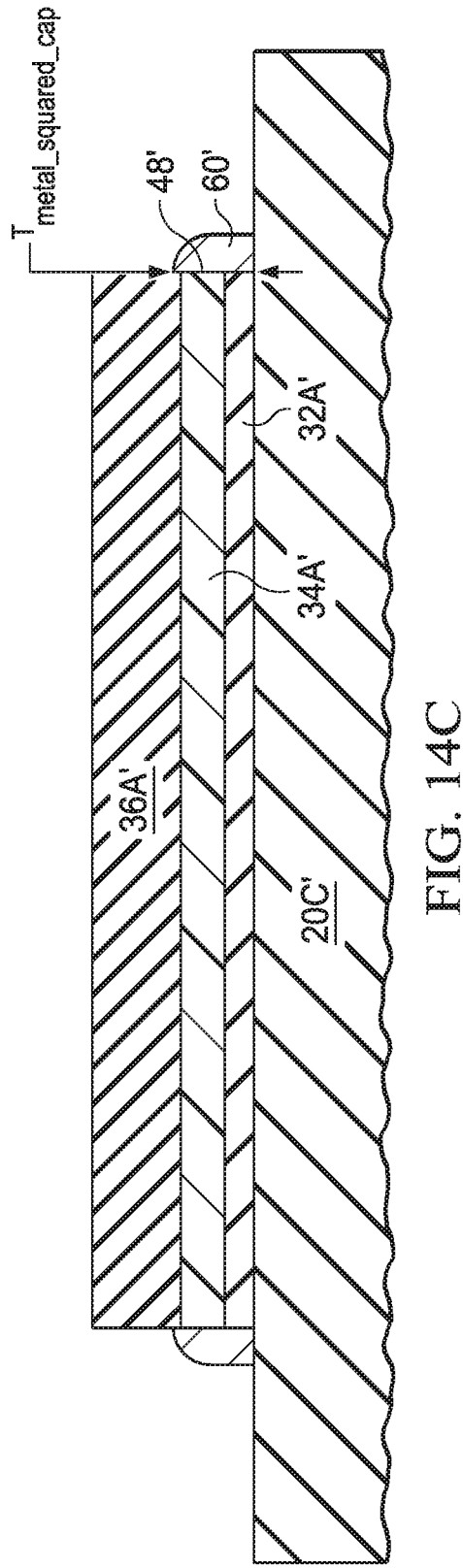

FIGS. 13A-13C and 14A-14C provide an example illustration of how the sloped lateral edges 44 of the TFR oxide cap 36A can facilitate the removal of selected portions of metal layer 60 (to physically separate interconnect elements 62C and 62D from each other), as compared with a similar structure having a TFR oxide cap with vertical ("squared-off") lateral edges. FIGS. 13A-13C are cross-section views of a selected portion of IC structure 10 defined by a cut line A-A shown in FIGS. 11 and 12, which extends into the page, such that the cross-sections shown in FIGS. 13A-13C are perpendicular to the cross-sections shown in FIGS. 1-12. In contrast, FIGS. 14A-14C are cross-section views of a selected portion of an IC structure 10' similar to IC structure 10 but having a TFR oxide cap with vertical ("squared-off") lateral edges, as opposed to the sloped lateral edges 44 of the TFR oxide cap 36A in FIGS. 1-12 and 13A-13C.

FIGS. 13A and 14A show (a) the selected portion of IC structure 10 after deposition of metal layer 60 over the TFR oxide cap 36A having sloped lateral edges 44, referred to below as sloped oxide cap edges 44 (FIG. 13A) and the selected portion of IC structure 10' after deposition of a metal layer 60' over the TFR oxide cap 36A' having vertical lateral edges 44', referred to below as vertical oxide cap edges 44'. The same metal thickness, indicated as $T_{metal}$, is deposited for metal layer 60 and metal layer 60'.

FIG. 13A thus corresponds with the state of IC structure 10 shown in FIG. 11, after forming and patterning the photomask 70 above the metal layer 60 and prior to the metal etch to define metal elements 62A-62D. As indicated in FIG. 13A, the illustrated cross-section is located within mask opening 72C shown in FIG. 11. In this example, the metal 60 in the illustrated cross-section should be fully removed by the metal etch through mask opening 72C, in order to remove any conductive connection provided by metal 60 between metal interconnect elements 62C and 62D (i.e., the metal contacts on opposing sides of the TFR element 34A), thereby preventing electrical shorts ("stringers") across the TFR element 34A. As shown in FIGS. 13A and 14A, the thickest portions of metal layer 60 and 60' are located adjacent the lateral edges 48 and 48' of the TFR elements 34A and 34A', indicated generally at locations 64 and 64', and thus the metal etch should be sufficient to remove the full metal thickness in these locations. As explained below, the sloped oxide cap edges 44 reduce the metal thickness in these locations, thus reducing the required metal etch parameter(s), e.g., etching time or etching intensity.

Metal layers 60' and 60' shown in FIGS. 13A and 13B may each comprise an aluminum layer, e.g., Al, AlCu, and AlSiCu, applied as a sputtered film. As known in the art, physical sputtered films such as Al, AlCu, and AlSiCu are typically not fully conformal. "Bread-loafing" occurs above the upper corners of physical structures, e.g., as shown in FIG. 13A at 66, and in FIG. 14A at 66'. As shown, the sloped oxide cap edges 44 shown in FIG. 13A reduce the extent of "bread-loafing" at the upper corners, as compared with the vertical oxide cap edges 44' shown in FIG. 14A. This reduced "bread-loafing" effect, along with the downwardly sloping contour of metal layer 60 over the sloped oxide cap edges 44, results in a vertical metal thickness $T_{metal\_sloped\_cap}$ adjacent the lateral edges 48 of the TFR element 34A (i.e., at locations 64 shown in FIG. 13), that is less than a vertical metal thickness $T_{metal\_squared\_cap}$ adjacent the lateral edges 48' of the TFR element 34A' of IC structure 10' (i.e., at locations 64' shown in FIG. 14). Thus, viewing $T_{metal\_sloped\_cap}$ in comparison to the lesser $T_{metal\_squared\_cap}$, it can be seen that the maximum vertical thickness of metal to be removed during the metal etch (to prevent electrical shorts across the TFR element 34A or 34A') is reduced as a result of the sloped oxide cap edges 44, as compared with vertical oxide cap edges 44'.

FIGS. 13B and 14B show the selected portions of IC structure 10 and IC structure 10' during the metal etch to remove each metal layer 60 and 60', respectively, which represents a state in time between the states shown in FIGS. 11 and 12. In particular, FIGS. 13B and 14B shows a state during the etch at which the horizontal regions of each metal layer 60 and 60', each having thickness $T_{metal}$, have been removed, while regions of metal layers 60 and 60' at the lateral edges 48, 48' of each TFR element 34A, 34A' still remain. As shown, the maximum remaining metal thickness $T_{metal\_sloped\_cap}$ in the structure having sloped oxide cap edges 44 (FIG. 13B), is smaller than the maximum remaining metal thickness $T_{metal\_squared\_cap}$ in the structure having squared oxide cap edges 44' (FIG. 14B), and thus requires a shorter etch time (or etch intensity) to remove fully.

FIGS. 13C and 14C show the selected portions of IC structure 10 and IC structure 10' after additional etch time (over etch), in particular at a time at which the thickest regions of metal layer 60 (at $T_{metal\_sloped\_cap}$) have been fully removed. FIG. 13C thus corresponds with the state of IC structure 10 shown in FIG. 12. As shown, in the structure having squared oxide cap edges 44' (FIG. 14C), a thickness of metal 60' (indicated at $T_{metal\_squared\_cap}$) still remains at the time when the metal layer 60 in IC structure 10 (FIG. 13C) has been fully removed. Thus, the sloped oxide cap edges 44 formed in IC structure 10 may reduce the etch time (or etch intensity) required to fully remove the metal 60 to prevent electrical shorts across the TFR element 34A. The reduced etch time (or etch intensity) allows for a thinner photoresist 70 (FIG. 11), which allows for tighter metal line spacing in IC structure 10, e.g., as compared with an IC structure using squared cap edges 44' (FIGS. 14A-14C). This reduction in metal line spacing may allow for an overall reduction in the size of IC structure 10, which may allow for more IC devices per wafer, which may reduce the cost per device.

Although the disclosed embodiments are described in detail in the present disclosure, it should be understood that various changes, substitutions and alterations can be made to the embodiments without departing from their spirit and scope.

What is claimed is:

1. A method of forming an integrated thin film resistor (TFR) in a semiconductor integrated circuit device, the method comprising:
    forming an integrated circuit (IC) structure including a plurality of IC elements and a plurality of conductive IC element contacts connected to the plurality of IC elements;
    forming a TFR film layer over the formed IC structure;
    forming a TFR dielectric layer over the TFR film layer;
    performing a wet etch to remove selected portions of the TFR dielectric layer to thereby define a TFR dielectric cap over the TFR film layer, wherein the wet etch stops at the TFR film layer, and wherein the wet etch defines sloped lateral edges of the TFR dielectric cap;
    after the wet etch, performing a TFR etch to remove selected portions of the TFR film layer to thereby define a TFR element;
    performing a TFR contact etch to form at least one TFR contact opening in the TFR dielectric cap over the TFR element; and
    forming a metal layer extending over the conductive IC element contacts and over the TFR dielectric cap, and extending into the at least one TFR contact opening and in contact with the TFR element; and
    at some time after forming the TFR film layer and before forming the metal layer, annealing the TFR film layer or the TFR element.

2. The method of claim 1, wherein the formed IC structure includes a memory cell or transistor structure including at least one conductive IC element contact connected to at least one of a source region, a drain region, and a gate region of the memory cell or transistor structure.

3. The method of claim 1, wherein the TFR film layer comprises silicon carbide chromium (SiCCr), silicon chromium (SiCr), chromium silicon nitride (CrSiN), tantalum nitride (TaN), tantalum silicide ($Ta_2Si$), or titanium nitride (TiN).

4. The method of claim 1, wherein the metal layer comprises aluminum.

5. The method of claim 1, wherein the TFR dielectric layer comprises an oxide layer.

6. The method of claim 1, wherein the TFR etch comprises a dry etch.

7. The method of claim 1, wherein the TFR anneal comprise an anneal at a temperature of at least 500° C.

8. The method of claim 1, wherein the TFR anneal comprise an anneal at a temperature of 515° C.±10° C. for a duration of 15-60 minutes.

9. The method of claim 1, wherein:
    the sloped lateral edges of the TFR dielectric cap are aligned over respective lateral edges of the TFR element;
    forming the metal layer comprises:
        depositing a conformal layer of metal over the TFR dielectric cap; and
        performing a metal etch to remove selected portions of the conformal layer of metal; and
    the deposited conformal layer of metal includes a sloped metal region extending over a respective sloped lateral edge of the TFR dielectric cap, the sloped metal region having a lower height at a first location adjacent a respective lateral edge of the TFR element than at a second location above a top upper surface of the TFR dielectric cap; and
    the metal etch removes the sloped metal region at the first location adjacent the respective lateral edge of the TFR element, wherein the lower height of the sloped metal region at the first location allows a reduced etching time or intensity to remove the full thickness of the sloped metal region at the first location.

10. The method of claim 1, further comprising forming an etch stop layer over the IC structure, and forming the TFR film layer over the etch stop layer.

11. The method of claim 1, comprising performing a metal etch process to remove selected portions of the metal layer to thereby define a plurality of metal interconnect elements.

12. The method of claim 11, wherein the metal etch process defines a contact element providing a conductive connection between the TFR element and at least one of the plurality of conductive IC element contacts.

13. The method of claim 1, wherein the TFR contact etch comprises a wet etch.

* * * * *